(12) United States Patent
Kim et al.

(10) Patent No.: US 8,116,125 B2
(45) Date of Patent: Feb. 14, 2012

(54) METHOD OF OPERATING A PHASE-CHANGE MEMORY DEVICE

(75) Inventors: Cheol-kyu Kim, Seoul (KR); Yoon-ho Khang, Yongin-si (KR); Ki-joon Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 238 days.

(21) Appl. No.: 12/081,451

(22) Filed: Apr. 16, 2008

(65) Prior Publication Data
US 2009/0141546 A1 Jun. 4, 2009

(30) Foreign Application Priority Data
Nov. 29, 2007 (KR) .................. 10-2007-0122737

(51) Int. Cl.
G11C 7/00 (2006.01)
G11C 7/12 (2006.01)
G11C 11/00 (2006.01)
G11C 7/22 (2006.01)
G11C 11/21 (2006.01)

(52) U.S. Cl. ............... 365/163; 365/189.16; 365/148
(58) Field of Classification Search ........... 365/163, 365/189.16, 148
See application file for complete search history.

(56) References Cited

U.S. PATENT DOCUMENTS

| | | | |
|---|---|---|---|
| 6,844,582 B2 * | 1/2005 | Ueda et al. ............... 257/295 |
| 7,031,181 B1 * | 4/2006 | Happ ......................... 365/148 |
| 7,292,469 B2 * | 11/2007 | Lee et al. ................... 365/163 |
| 7,327,602 B2 * | 2/2008 | Kostylev et al. .......... 365/163 |
| 2008/0117704 A1 * | 5/2008 | Happ et al. ................ 365/222 |
| 2008/0219040 A1 * | 9/2008 | Philipp ...................... 365/148 |
| 2008/0273371 A1 * | 11/2008 | Philipp et al. ............. 365/148 |
| 2009/0003035 A1 * | 1/2009 | Philipp et al. ............. 365/148 |

* cited by examiner

*Primary Examiner* — J. H. Hur
(74) *Attorney, Agent, or Firm* — Harness, Dickey & Pierce, P.L.C.

(57) ABSTRACT

A method of operating a phase-change memory device, including a phase-change layer and a unit applying a voltage to the phase-change layer, which includes applying a reset voltage to the phase-change layer, wherein the reset voltage includes at least two pulse voltages which are continuously applied.

20 Claims, 4 Drawing Sheets

METHOD OF OPERATING A PHASE-CHANGE MEMORY DEVICE

PRIORITY STATEMENT

This application claims the benefit of priority under 35 U.S.C. §119 from Korean Patent Application No. 10-2007-0122737, filed on Nov. 29, 2007, in the Korean Intellectual Property Office, the disclosure of which is incorporated herein in its entirety by reference.

BACKGROUND

1. Field

Example embodiments relate to a method of operating a memory device. Other example embodiments relate to a method of operating a phase-change memory device.

2. Description of the Related Art

There are several types of non-volatile memory devices including a flash memory, a ferroelectric RAM (FeRAM), a magnetic RAM (MRAM) and phase-change random access memories (PRAMs). A storage node of a PRAM is structurally different than other non-volatile memory devices.

A storage node of a PRAM includes a phase-change layer as a data storage layer. If a predetermined reset voltage is applied to the phase-change layer for a substantially short amount of time, a region of the phase-change layer changes to an amorphous region. If a predetermined set voltage is applied to the storage node for a substantially long amount of time, the amorphous region returns to a crystalline state.

Assuming that a first resistance pertains to the phase-change layer having an amorphous region and a second resistance pertains to the phase-change layer having no amorphous region, the first resistance is higher than the second resistance.

The PRAM is a memory device that writes and reads bit data using a phase-change layer having resistance characteristics that vary depending on the phase of the phase-change layer.

A conventional method of operating the PRAM may have a substantially slow operation speed because a set amount of time for the amorphous region to return to the crystalline state is relatively long.

In the conventional method of operating the PRAM, the characteristics of the phase-change layer may easily deteriorate by repeating the reset and set operations, shortening the durability (or endurance) of the PRAM.

SUMMARY

Example embodiments relate to a method of operating a memory device. Other example embodiments relate to a method of operating a phase-change memory device.

Example embodiments provide a method of operating a phase-change memory device using a phase change layer having resistance characteristics that vary depending on a phase of the phase-change layer.

According to example embodiments, there is provided a method of operating a phase-change memory device having a phase-change layer and a unit applying a voltage to the phase-change layer, the method including applying a reset voltage to the phase-change layer, wherein the reset voltage includes at least two pulse voltages which are continuously applied. The pulse voltages may be substantially the same.

A pulse width of each of the pulse voltages may be less than 20 ns. A pulse width of each of the pulse voltages may range from 5 ns to 20 ns. An interval between the pulse voltages may be less than 100 ns. The interval between the pulse voltages may be greater than 5 ns. The interval between the pulse voltages may range from 5 ns to 100 ns. The number of the pulse voltages may range 2 to 10.

The method may include applying a set voltage to the phase-change layer, after the applying of the reset voltage to the phase-change layer.

The reset voltage may be applied for an equal or less amount of time than the set voltage.

BRIEF DESCRIPTION OF THE DRAWINGS

Example embodiments will be more clearly understood from the following detailed description taken in conjunction with the accompanying drawings.

FIG. 1 is a diagram illustrating a cross-sectional view for explaining a method of operating a phase-change random access memory (PRAM) according to example embodiments;

FIG. 2 is a graph illustrating a reset voltage usable in a method of operating a PRAM according to example embodiments;

FIG. 3 is a diagram illustrating a cross-sectional view of a PRAM reset using the reset voltage of FIG. 2;

FIG. 4 is a graph illustrating a reset voltage used in a conventional method of operating a PRAM according to a comparative example;

FIG. 5 is a diagram illustrating a cross-sectional view of a PRAM reset using the reset voltage of FIG. 4;

FIG. 6 is a graph illustrating reset resistances of a first cell of a PRAM reset in a method according to example embodiments and a method according to a comparative example; and FIG. 7 is a graph illustrating a resistance variation of a first cell of a PRAM and a set pulse width if the first cell reset is changed to a set state in a method according to example embodiments and a method according to a comparative example.

DETAILED DESCRIPTION OF EXAMPLE EMBODIMENTS

Figure 1:
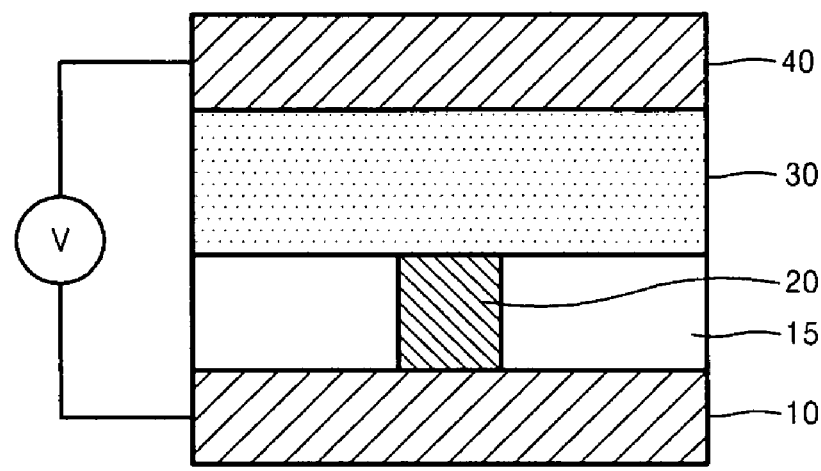
FIGS. 1-7 represent non-limiting, example embodiments as described herein.

Various example embodiments will now be described more fully with reference to the accompanying drawings in which some example embodiments are shown. In the drawings, the thicknesses of layers and regions may be exaggerated for clarity.

Detailed illustrative embodiments are disclosed herein. However, specific structural and functional details disclosed herein are merely representative for purposes of describing example embodiments. This invention may, however, may be embodied in many alternate forms and should not be construed as limited to only example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of example embodiments.

Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In order to more specifically describe example embodiments, various aspects will be described in detail with reference to the attached drawings. However, the present invention is not limited to example embodiments described.

Example embodiments relate to a method of operating a memory device. Other example embodiments relate to a method of operating a phase-change memory device.

FIG. 1 is a diagram illustrating a cross-sectional view of a method of operating a phase-change random access memory (PRAM) according to example embodiments.

Referring to FIG. 1, the PRAM may include a lower electrode 10, a lower electrode contact layer 20, a phase-change layer 30 and an upper electrode 40, which are stacked sequentially (or in parallel). The lower electrode contact layer 20 may have a width less than that of the lower electrode 10. The lower electrode contact layer 20 may connect the lower electrode 10 and the phase-change layer 30. An interlayer insulating layer 15 surrounding the lower electrode contact layer 20 may be formed between the lower electrode 10 and the phase-change layer 30. Although not shown in FIG. 1, one of the lower electrode 10 and the upper electrode may be connected to a switching element. The switching element may be a transistor formed on a substrate (not shown) or other elements (e.g., a diode).

The phase of a region of the phase-change layer 30 contacting the lower electrode contact layer 20 may be changed according to a voltage V applied between the lower electrode 10 and the upper electrode 40. The overall phase-change layer 30 shown in FIG. 1 is in a crystalline state.

Figure 2:
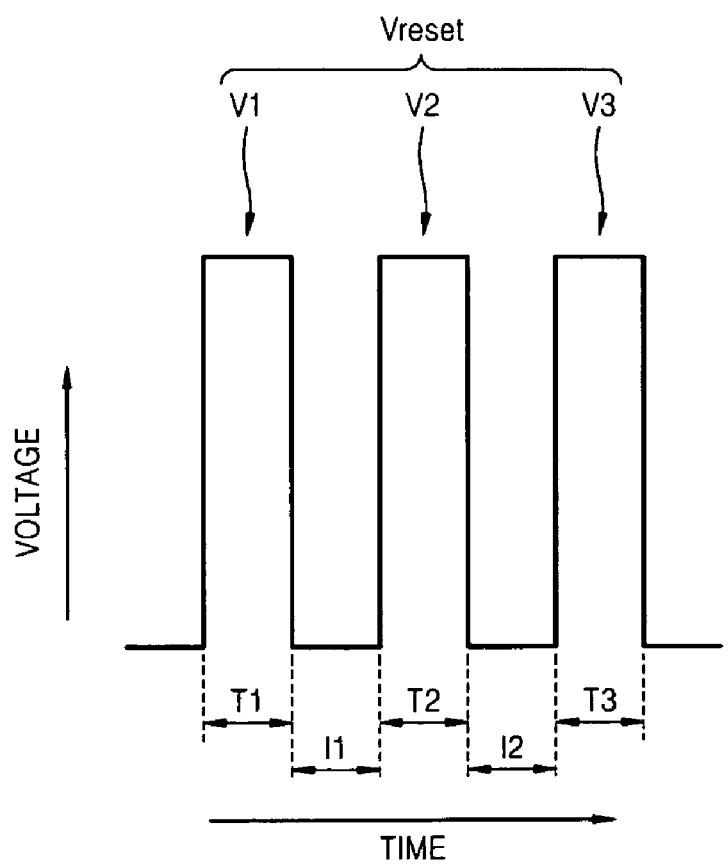

FIG. 2 is a graph illustrating a reset voltage Vreset applied between the lower electrode 10 and the upper electrode 40 in a method of operating a PRAM according to example embodiments.

Referring to FIG. 2, the reset voltage Vreset may include two or more pulse voltages (e.g., first, second and third pulse voltages V1, V2, V3), which are continuously applied at predetermined intervals.

Magnitudes of the first, second and third pulse voltages V1, V2, V3 may be the same. First, second and third pulse widths T1, T2, T3, for which the first, second and third pulse voltages V1, V2, V3, respectively, are applied may be the same. As such, the first, second and third pulse voltages V1, V2, V3 may be substantially the same. Each of the first, second and third pulse widths T1, T2, T3 may be less than 20 nanoseconds (ns). Each of the first, second and third pulse widths T1, T2, T3 may range from 5 ns to 20 ns. A first interval 11 between the first pulse voltage V1 and second pulse voltage V2 and a second interval 12 between the second pulse voltage V2 and third pulse voltage V3 may, or may not, be equal to each other. Each of the first interval 11 and second interval 12 may be less than 100 ns. Each of the first interval 11 and second interval 12 may range from 5 ns to 100 ns.

If such short pulse voltages are continuously applied at predetermined intervals, the region of the phase-change layer 30 contacting the lower electrode contact layer 20 may change to an amorphous region. For example, if the reset voltage Vreset of FIG. 2 is applied between the lower electrode 10 and the upper electrode 40 of FIG. 1, the PRAM of FIG. 1 may change as shown in FIG. 3.

Figure 3:
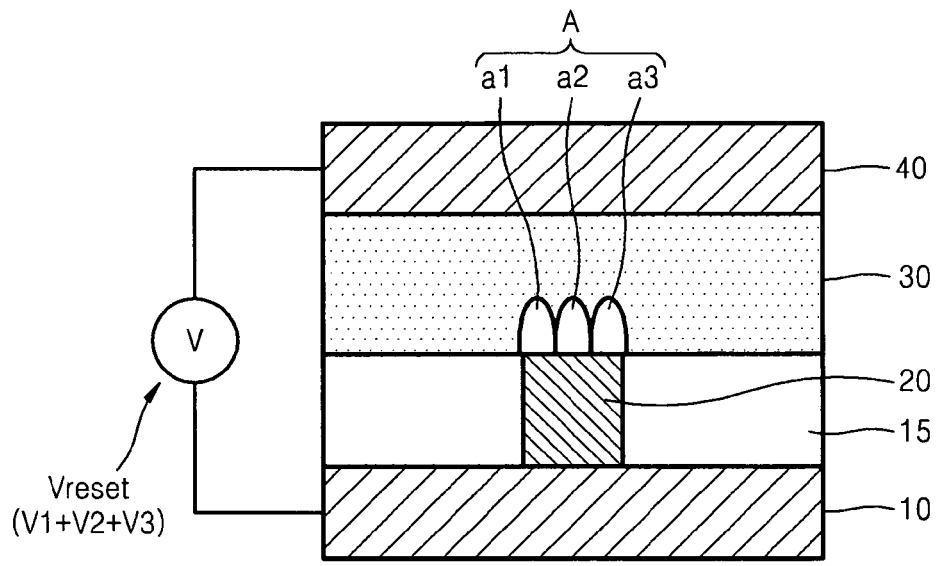

FIG. 3 is a diagram illustrating a cross-sectional view of a PRAM reset using the reset voltage of FIG. 2.

Referring to FIG. 3, the region of the phase-change layer 30 contacting the lower electrode contact layer 20 may change, due to the reset voltage Vreset, into an amorphous region A. The amorphous region A may include first, second and third regions a1, a2, a3. At least one of the first, second and third regions a1, a2, a3 may become amorphous regions due to the first, second and third pulse voltages V1, V2, V3, respectively, of FIG. 2.

A local region of the phase-change layer 30 may melt due to the first pulse voltage V1 and cool for a time corresponding to the first interval I1 to become an amorphous region. The amorphous local region may be one of the first, second or third regions a1, a2, a3. For example, the amorphous local region may be the second region a2. If the second region a2 is an amorphous region, the second region a2 has a resistivity higher than crystalline regions around the amorphous region a2. If the second pulse voltage V2 is applied between the lower electrode 10 and the upper electrode 40, current flows through the crystalline regions around the amorphous local region (e.g., second region a2), heating a portion of the crystalline regions. One (e.g., the first region a1) of the other two regions (e.g., the first region a1 and the third region a3) may be formed from the heated regions. The remaining region (e.g., third region a3) may be formed by the third pulse voltage V3.

Although the reset voltage Vreset includes the first, second and third pulse voltages V1, V2, V3 in FIGS. 2 and 3, the reset voltage Vreset may include two pulse voltages. The reset voltage Vreset may include four or more (e.g., 4 to 10) pulse voltages. The number of minute amorphous regions formed in FIG. 3 may vary depending on the number of pulse voltages constituting the reset voltage Vreset.

Figure 4:
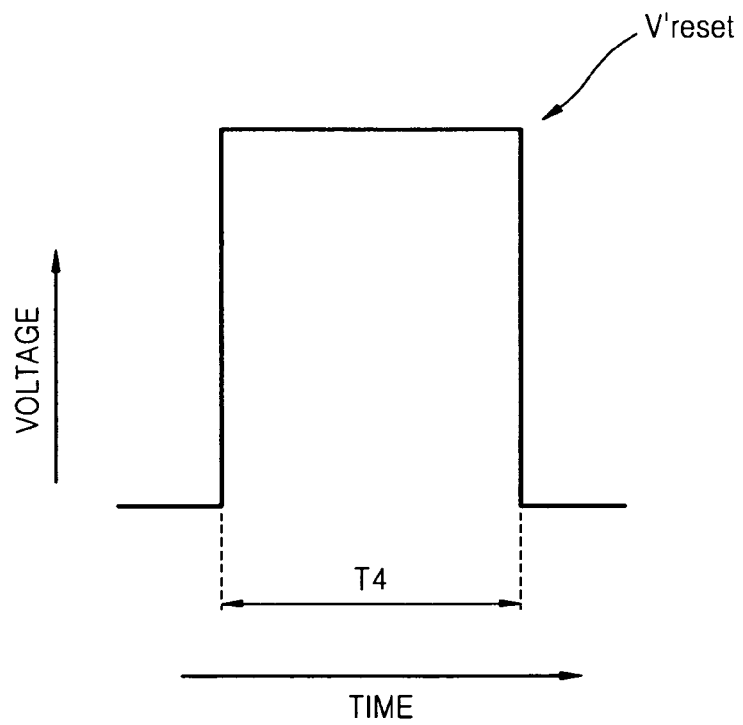

FIG. 4 is a graph illustrating a reset voltage V'reset applied between the lower electrode 10 and the upper electrode 40 of FIG. 1 in a conventional method of operating a PRAM according to a comparative example.

Referring to FIG. 4, the reset voltage V'reset is one pulse voltage. The reset voltage V'reset has a relatively long fourth pulse width T4 for which the reset voltage V'reset is applied. For example, the fourth pulse width T4 may be similar to the sum of the first, second and third pulse widths T1, T2, T3 of FIG. 2. A magnitude of the reset voltage V'reset of FIG. 4 may be the same as that of each of the first, second and third pulse voltages V1, V2, V3 of FIG. 2. As such, the total energy of the reset voltage V'reset of FIG. 4 may be the same as the total energy of the reset voltage Vreset of FIG. 2.

Figure 5:
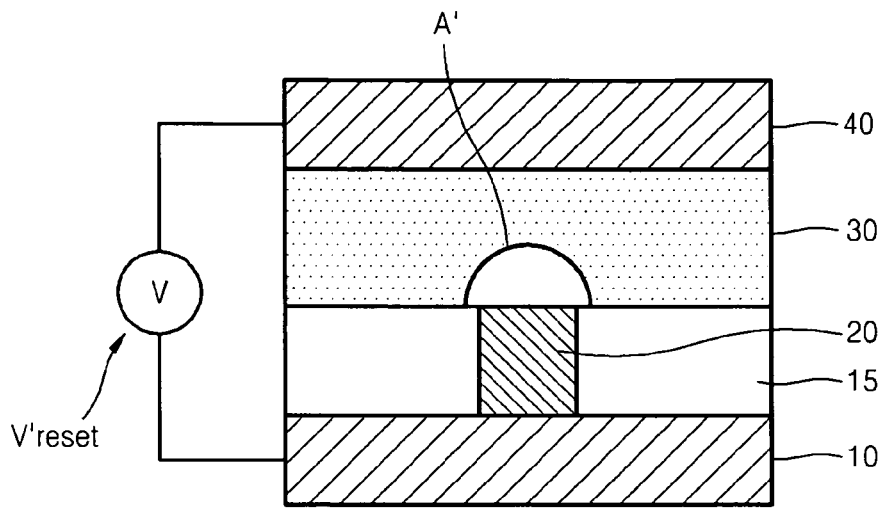

If the reset voltage V'reset of FIG. 4 is applied between the lower electrode 10 and the upper electrode 40 of FIG. 1, the PRAM of FIG. 1 may change as shown in FIG. 5.

FIG. 5 is a diagram illustrating a cross-sectional view of a PRAM reset using the reset voltage of FIG. 4.

Referring to FIG. 5, a region of the phase-change layer 30 contacting the lower electrode contact layer 20 changes, due to the reset voltage V'reset, into an amorphous region A'. The amorphous region A' may have a volume similar to that of the amorphous region A of FIG. 3.

A region of the phase-change layer 30 is heated by the reset voltage V'reset of FIG. 5. Because the reset voltage V'reset is applied for a relatively long amount of time, a portion of the heated region of the phase-change layer 30 may be heated to a substantially high temperature (hereinafter referred to as a "first temperature"). For example, if current excessively flows through a region along a grain boundary of the phase-change layer 30 due to the reset voltage V'reset, the region through which the current excessively flows may be heated to the first temperature.

Because the first, second and third regions a1, a2, a3 of FIG. 3 are formed by the first, second and third pulse voltages V1, V2, V3 (each of which is applied for a relatively short time) the first, second and third regions a1, a2, a3 may be heated to a temperature less than the first temperature and cool such that the first, second and third regions a1, a2, a3 become amorphous regions. Although the reset voltage Vreset of FIG. 2 and the reset voltage V'reset of FIG. 4 have the same energy, a temperature to which the phase-change layer 30 is heated by the reset voltage Vreset of FIG. 2 may be lower than a temperature to which the phase-change layer 30 is heated by the reset voltage Vreset of FIG. 4.

Because a method of operating a PRAM according to example embodiments may prevent (or reduce) the phase-change layer from being excessively heated during a reset operation, the durability of the PRAM may increase. If a region of a phase-change layer becomes an amorphous region by excessively heating and cooling, it may be difficult to return the amorphous region to a crystalline region, increasing the set time. In a method of operating a PRAM according to example embodiments, the PRAM has a shorter set time because the phase-change layer is not excessively heated during a reset operation.

In a method of operating a PRAM according to example embodiments, because a resistance of the phase-change layer is not measured between the pulse voltages applied during the reset operation, time necessary for measuring the resistance decreases.

Figure 6:
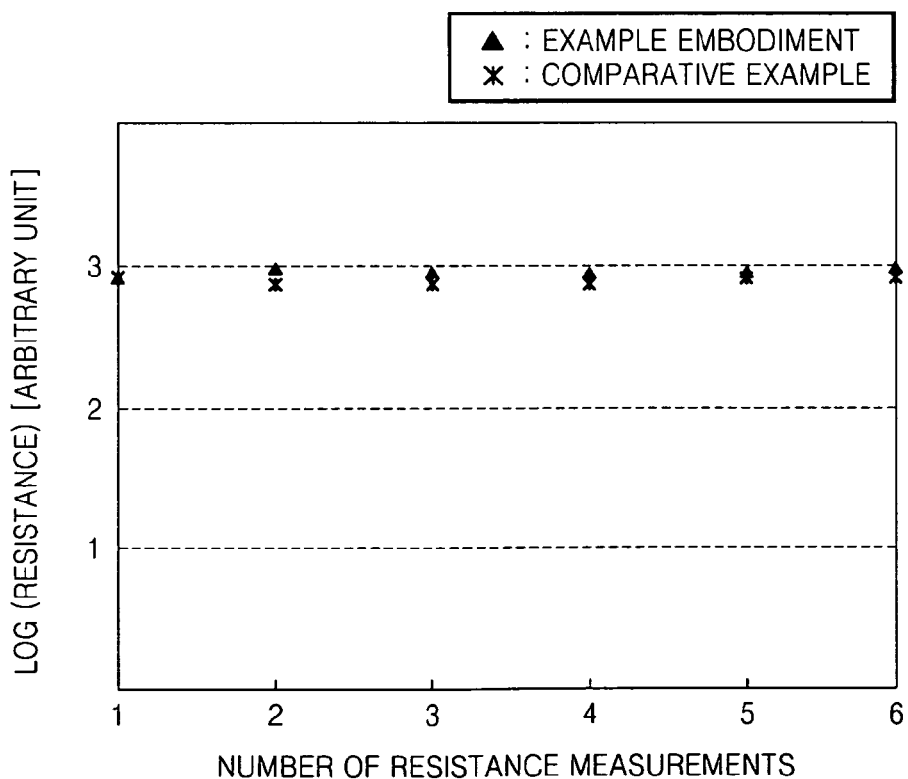

FIG. 6 is a graph illustrating reset resistances of a first cell of a PRAM reset by a method according to example embodiments and by a method according to the comparative example. In FIG. 6, data marked by ▲ are resistances of the first cell reset by a first reset voltage in the method according to example embodiments, and data marked by * are resistances of the first cell reset by a second reset voltage in the method of FIG. 4 according to the comparative example. The first reset voltage includes first, second, third, fourth and fifth pulse voltages, which are respectively applied for approximately 10 ns. The second reset voltage includes one pulse voltage having a pulse width of approximately 50 ns. Magnitudes of the first, second, third, fourth and fifth pulse voltages of the first reset voltage and the second reset voltage may be approximately 3.7 V.

Referring to FIG. 6, the data marked by * and the data marked ▲ are almost the same. Reset resistances if the first, second, third, fourth and fifth pulse voltages having a pulse width of 10 ns are applied at intervals of 10 ns and if the pulse voltage is applied once for 50 ns, the reset resistances are similar to each other.

Figure 7:
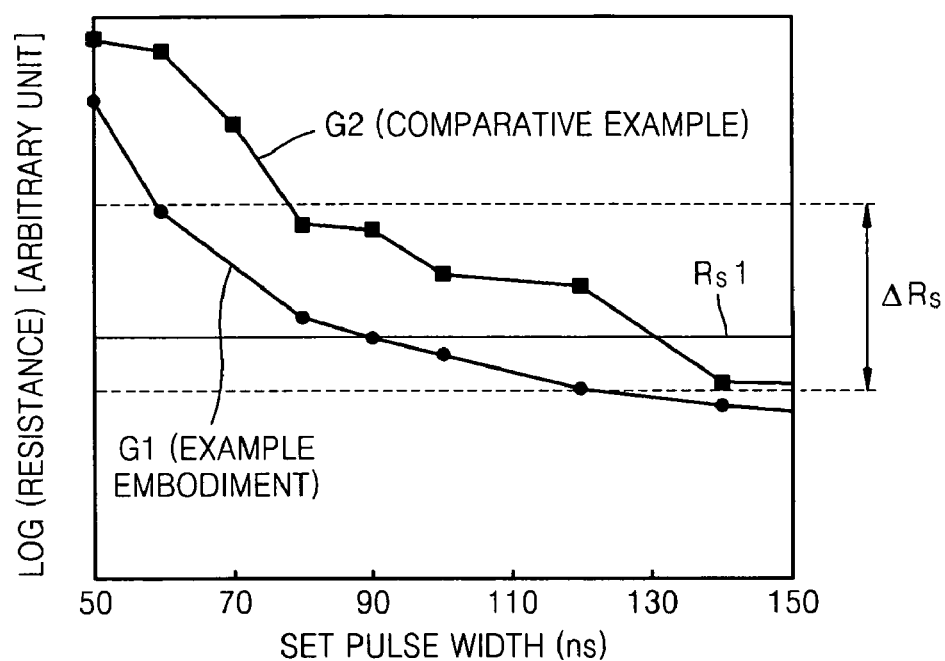

FIG. 7 is a graph illustrating a resistance variation of a first cell of a PRAM and a set pulse width if the first cell reset is changed to a set state by a method according to example embodiments and by a method according to a comparative example. In FIG. 7, a first graph G1 shows a resistance variation of the first cell if the first cell reset is changed to a set state by the first reset voltage according to example embodiments, and a second graph G2 shows a resistance variation of the first cell if the first cell reset is changed to a set state by the second reset voltage according to the comparative example. A set voltage having a magnitude of approximately 1.8 V is used.

Referring to FIG. 7, the first graph G1 is located below the second graph G2 because if set voltages are applied for the same time, a resistance value of the first graph G1 is lower than a resistance value of the second graph G2. As such, a time to set the PRAM reset by the method according to example embodiments is shorter than a time taken to set the PRAM reset by the method according to the comparative example. ΔRs denotes a reference resistance range usable to measure a set resistance. A difference in set pulse width between the first graph G1 and the second graph G2 is approximately 40 ns on a first reference resistance line Rs1 within the reference resistance range. A set time in the method according to example embodiments is approximately 30% shorter than a set time in the method according to the comparative example.

A set time of a PRAM according to example embodiments is more than 100 ns, which is longer than a reset time. A programming time is determined by the set time that is longer than the reset time. Even though a reset time T1+I1+T2+I2+T3 of FIG. 2 is slightly longer than a conventional reset time, a programming time in the method according to example embodiments may be shorter. If a total applying time of the reset voltage Vreset of FIG. 2 is shorter than or equal to a set time, because a programming time is determined by the set time, a programming time in the method according to example embodiments is shorter than a programming time in a conventional method of operating a PRAM. A total reset pulse width used in the method according to example embodiments may be equal to or less than a set pulse width. A set pulse width for which a set pulse is applied to the phase-change layer 30 to change the amorphous region A of FIG. 3 into a crystalline region may be equal to or larger than a total reset pulse width.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A method of programming a phase-change memory device having a phase-change layer, a first electrode contact layer, and a unit applying a voltage to the phase-change layer, the programming method comprising:
    applying a reset voltage to the phase-change layer via the first electrode contact layer in a programming step for data writing such that a phase change is initiated at a surface of the phase-change layer contacting the first electrode contact layer,
    wherein the reset voltage includes at least two pulse voltages which are continuously applied in the same programming step.

2. The method of claim 1, wherein the at least two pulse voltages are applied with identical magnitude.

3. The method of claim 2, wherein a pulse width of the at least two pulse voltages are equal.

4. The method of claim 1, wherein a pulse width of each of the at least two pulse voltages is less than 20 ns.

5. The method of claim 4, wherein the pulse width of each of the at least two pulse voltages ranges from 5 ns to 20 ns.

6. The method of claim 4, wherein an interval of 100 ns or less is between each of the at least two pulse voltages.

7. The method of claim 6, wherein the interval between the at least two pulse voltages ranges from 5 ns to 100 ns.

8. The method of claim 4, wherein an interval greater than 5 ns is between each of the at least two pulse voltages.

9. The method of claim 8, wherein the interval is less than 100 ns.

10. The method of claim 1, wherein an interval of 100 ns or less is between each of the at least two pulse voltages.

11. The method of claim 10, wherein the interval between the at least two pulse voltages ranges from 5 ns to 100 ns.

12. The method of claim 1, wherein an interval greater than 5 ns is between each of the at least two pulse voltages.

13. The method of claim 12, wherein the interval is less than 100 ns.

14. The method of claim 1, wherein a number of the pulse voltages applied ranges 2 to 10.

15. The method of claim 1, further comprising applying a set voltage to the phase-change layer, after the reset voltage is applied.

16. The method of claim 15, wherein the reset voltage is applied for an equal or shorter amount of time than the set voltage.

17. The method of claim 1, wherein the phase change is initiated such that a surface of the phase-change layer that directly contacts the first electrode contact layer is changed into an amorphous region.

18. The method of claim 1, wherein a top surface area of the first electrode contact layer is less than a bottom surface area of the phase-change layer.

19. A method of programming a phase-change memory device having a phase-change layer, a first electrode contact layer, and a unit applying a voltage to the phase-change layer, the method comprising:
    applying a reset voltage to the phase-change layer via the first electrode contact layer in a programming step for data writing, wherein the reset voltage includes at least two pulse voltages which are continuously applied in the same programming step,
    wherein applying the reset voltage to the phase-change layer includes,
    applying a first pulse voltage to the phase-change layer via the first electrode contact layer in a programming step for data writing such that a first phase change is initiated at a first surface of the phase-change layer contacting the first electrode contact layer; and
    applying a second pulse voltage to the phase-change layer via the first electrode contact layer in the programming step for data writing such that a second phase change is initiated at a second surface of the phase-change layer contacting the first electrode contact layer, wherein the second surface is disposed adjacent to the first surface.

20. The method of claim 19, further comprising:
    after applying a second pulse voltage to the phase-change layer, applying a third pulse voltage to the phase-change layer via the first electrode contact layer in the programming step for data writing such that a third phase change is initiated at a third surface of the phase-change layer contacting the first electrode contact layer, wherein the third surface is disposed adjacent to the first surface and opposite to the second surface.

* * * * *